United States Patent [19]
Wilmoth et al.

[11] Patent Number: 4,868,790
[45] Date of Patent: Sep. 19, 1989

[54] REFERENCE CIRCUIT FOR INTEGRATED MEMORY ARRAYS HAVING VIRTUAL GROUND CONNECTIONS

[75] Inventors: David D. Wilmoth; Tim M. Coffman, both of Sugar Land; John F. Schreck, Houston, all of Tex.; Jeffrey Kaszubinski, San Jose, Calif.

[73] Assignee: Texas Instruments Incorporated, Dallas, Tex.

[21] Appl. No.: 187,134

[22] Filed: Apr. 28, 1988

[51] Int. Cl.$^4$ .......................... G11C 7/00; G11C 11/40
[52] U.S. Cl. .................................... 365/210; 365/104; 365/185
[58] Field of Search ............... 365/185, 104, 210, 189, 365/184

[56] References Cited

U.S. PATENT DOCUMENTS

| | | | |
|---|---|---|---|
| 4,237,547 | 12/1980 | Smith | 365/104 |
| 4,387,447 | 6/1983 | Klaas et al. | 365/185 |
| 4,460,981 | 7/1984 | Van Buskirk et al. | 365/104 |
| 4,703,453 | 10/1987 | Shinoda et al. | 365/210 |
| 4,723,225 | 2/1988 | Kaszubinski et al. | 365/185 |

FOREIGN PATENT DOCUMENTS 0056290 4/1983 Japan .................................. 365/104

Primary Examiner—Stuart N. Hecker
Assistant Examiner—Glenn A. Gossage
Attorney, Agent, or Firm—Theodore D. Lindgren

[57] ABSTRACT

A reference-column circuit for supplying a reference voltage to be used in sensing programming status of read-only-memory cells in a memory array having virtual-ground circuit connections is disclosed. The reference-column circuit includes an adjacent non-programmed memory cell having a common terminal with an identical non-programmed memory cell of prior-art circuitry. The additional memory cell and associated grounding circuit provide a compensating component of reference voltage to the input of a sense amplifier, the compensating component acting to eliminate a source of possible errors in sense amplifier transmission caused by non-programmed adjacent memory cells in the memory array.

13 Claims, 1 Drawing Sheet

REFERENCE CIRCUIT FOR INTEGRATED MEMORY ARRAYS HAVING VIRTUAL GROUND CONNECTIONS

BACKGROUND OF THE INVENTION

This invention relates to a reference-column circuit for supplying a reference voltage to be used in sensing whether or not memory cells are programmed. In a specific example, the reference-column circuit is used to sense the presence or absence of charges on the floating gates of floating-gate, avalanche-injection, metal-oxide-semiconductor (FAMOS) devices that comprise an integrated-circuit logic array. The reference-voltage circuit of this invention is used in logic arrays having virtual-ground circuit connections.

Virtual-ground circuits for erasable-programmable-read-only-memory (EPROM) integrated-circuit devices are described, for example, in U.S. Pat. No. 4,151,021 issued to David J. McElroy and in U.S. Pat. No. 4,387,447 issued to Jeffrey M. Klaas, et al., both patents assigned to Texas Instruments Incorporated. Use of virtual-ground circuits in floating-gate memory arrays allows a decrease in cell size or an increase in bit density by eliminating the need for a ground line for each column or output line. "Dummy" cells, or reference column circuits, may be used with virtual ground arrangements to create a reference voltage that is used to form a sense voltage differential or margin, as described in U.S. Pat. No. 4,301,518 issued to Jeffrey M. Klaas and assigned to Texas Instruments Incorporated.

In general, the sense margin or voltage differential between a programmed (or non-programmed) read-only-memory cell output and the output of a dummy cell is controlled by varying the width-to-length ratio of certain transistor channels in the logic array in relation to the width-to-length ratio of certain transistor channels in the dummy cell.

Virtual-ground circuits in memory arrays are characterized by connection of only one output conductor to a common source-drain path terminal of two adjacent floating-gate transistors. During read operation, a reference voltage source is connected to the non-common source-drain path terminal of one of the two floating-gate transistors. The non-common source-drain terminal of the other floating-gate transistor is connected to ground or other source of reference potential. The voltage at the common node will be larger if the source-drain paths of both transistors are conductive, or not programmed, than the voltage would be without the common source-drain connection. The voltage at the common source-drain connection is used to sense the presence or absence of a programming charge on the floating gate of one of the two floating-gate transistors by comparing that voltage with the voltage output of the reference-column circuit or dummy cell.

Prior-art reference-column circuits have been comprised of a dummy cell with only one floating-gate transistor that furnishes a reference voltage for comparison with the voltage output at the common source-drain connection of the floating-gate transistors of a memory array. Because the voltage output at the common source-drain connection of the floating-gate transistors may have two values depending on whether or not the adjacent floating-gate transistor is conductive, there is a need for a reference-column circuit that will furnish a reference voltage that will not cause the sense amplifier to give an erroneous output signal if an adjacent floating-gate transistor is conductive. The same need exists for memory arrays comprised of other types of memory cells.

SUMMARY OF THE INVENTION

The reference-column circuit of this invention, as described herein, includes an adjacent non-programmed memory cell with a virtual-ground-type sensing terminal in common with the non-programmed memory cell that is typical of prior-art dummy cells. The voltages applied to the non-common terminals of the two memory cells are such that the reference voltage output has a magnitude that results in a consistent reading of the programmed status of the memory cells of the logic array, whether or not the adjacent memory cells are conductive. The circuit decreases the possibility that incorrect data will be transmitted by the sense amplifier that reads the sense-voltage difference between the logic array voltage output and the dummy-cell reference voltage output.

BRIEF DESCRIPTION OF THE DRAWINGS

The novel features of this invention are set forth in the appended claims. The invention, its features, and its advantages are described below in conjunction with the following drawings:

DETAILED DESCRIPTION OF THE SPECIFIC EMBODIMENT

Figure 1:
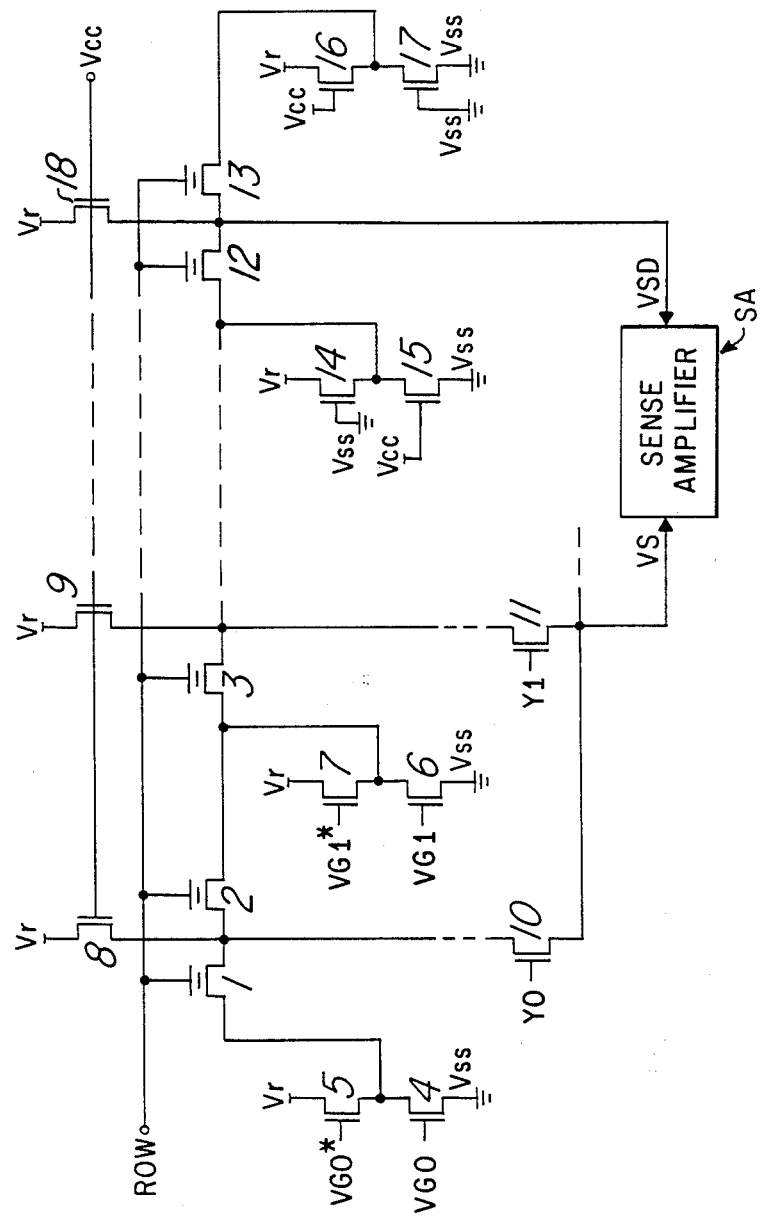
FIG. 1 is a circuit diagram of the reference-column circuit of this invention as used with an example section of a logic array of read-only-memory devices having virtual-ground circuit connections.

Referring to FIG. 1, an equalized, biased virtual-ground-type memory array is characterized by transistors 1–11, which are part of an integrated-circuit having many more rows and columns of programmable memory cells than the numbers indicated in the Figure. Memory cells 1–3 are illustrated as N-channel floating-gate transistors and are connected with source-drain paths in series and with programming input terminals connected to a row conductor. Alternate source-drain terminals of floating-gate transistors 1–3 are connected to the output common source-drain terminals of virtual-ground transistor pairs 4,5 and 6,7. Virtual-ground transistor pairs 4,5 and 6,7 are comprised of N-channel transistors with source-drain paths connected in series between reference voltage source Vr and ground or other source of reference potential. The gates of transistors 4, 5, 6, and 7 are connected to decoder circuit outputs VG0, VG0*, VG1 and VG1*, respectively, where the asterisk indicates complementary voltage. The decoder circuit is not shown. The other source-drain terminals of floating-gate transistors 1–3 are connected to reference voltage source Vr through the source-drain paths of N-channel load transistors 8 and 9. The gates of load transistors 8 and 9 are connected to supply voltage source Vcc, the voltage of which is greater than that of reference voltage source Vr. The other source-drain terminals of floating-gate transistors 1–3 are also connected to sense amplifier SA by the source-drain paths of N-channel column-select transistors 10 and 11. The gates of column-select transistors 10 and 11 are connected to decoder circuit outputs Y0 and Y1, respectively. For the purposes of this explanation, it may be assumed that decoder output Y0 is high and that decoder output Y1 and all other column-select decoder outputs are low. Therefore, column-select transistor 10 is conductive and column-select transistor 1 and all other column-select transistors are nonconductive.

During read operation to determine the presence or absence of a charge on the floating gate of floating-gate transistor 1, the decoder circuit inputs to the gates of virtual-ground transistor pairs 4,5 and 6,7 are such that VG0* and VG1 are low and such that VG0 and VG1* are high. Therefore, the transistors 4 and 7 are conductive and transistors 5 and 6 are nonconductive. The voltage VS at the input to the sense amplifier SA is the voltage across the source-drain path of transistor 1, which varies according to the programmed status of transistors 1 and 2 as described in the following paragraphs.

If, for example, the floating gate of transistor 1 is not charged or is erased and the floating gate of transistor 2 is charged or programmed, then transistor 1 will be conductive and transistor 2 will be nonconductive. In that event, the voltage VS and the read input to the sense amplifier SA will be primarily determined by the voltage division of reference voltage source Vr between transistor 1 and transistor 8, assuming a high input impedance to the sense amplifier SA.

However, if the floating gates of both floating-gate transistors 1 and 2 are not charged or are erased, then the voltage VS will be greater than it would be with only transistor 1 not charged or erased. The reason is that, with transistor 2 conductive, the voltage VS will be the fraction of reference voltage Vr effectively determined by voltage division of transistor 1 and the parallel transistor combination 2,8. The reduction in the effective load impedance caused by the parallel combination of transistors 2 and 8 will raise the voltage VS and, in some circumstances, cause the sense amplifier SA to misread the programmed status of transistor 1 if compensation is not included in the sense-reference voltage VSD to sense amplifier SA.

Referring again to FIG. 1, transistors 12-18 comprise an embodiment of the reference-column sense-voltage circuit of this invention. First and second dummy memory cells 12 and 13 are illustrated as N-channel floating-gate transistors and are formed using the same process and dimensions of floating-gate transistors 1-3 and have a common source-drain path terminal that is connected to the reference input terminal VSD of the sense amplifier SA. Dummy floating-gate transistor 12 is connected as in prior-art circuits to the output common virtual-ground sensing terminal of a grounding circuit comprised of dummy ground-select transistor pair 14,15. The source-drain paths of transistors 14 and 15 are connected in series between reference voltage source Vr and ground or other source Vss. The gate of N-channel transistor 14 is connected to ground or other source Vss and the gate of N-channel transistor 15 is connected to supply voltage Vcc. Therefore, the non-common source-drain path terminal of floating-gate transistor 12 is at circuit ground or other source Vss potential.

Second dummy floating-gate transistor 13 and dummy ground-select transistor pair 16,17 are added to prior-art circuitry to form the illustrated embodiment of this invention. Floating-gate transistor 13 is connected to the output common source-drain path terminal of a reference-supply-voltage circuit comprised of dummy ground-select transistor pair 16,17. The source-drain paths of transistors 16 and 17 are connected in series between reference voltage source Vr and circuit ground or other source Vss potential.

The primary current path, or source-drain path, of N-channel load transistor 18 is connected between reference voltage source Vr and the common source-drain path terminals of transistors 12 and 13. The gate of load transistor 18 is connected to supply voltage Vcc. The width and length of the channel of load transistor 18 are such that the resistance of load transistor 18 is sufficiently less than the resistance of load transistors 8 and 9, as determined by the width and length of those transistors 8 and 9.

Because transistors 12 and 13 are conductive, the reference voltage VSD at the reference input to sense amplifier SA is the fraction of reference voltage Vr determined by voltage division between transistor 12 and the parallel transistor combination 13,18, assuming a high input impedance to sense amplifier SA at the VSD input. Therefore, the reference voltage VSD includes a component determined by transistors 13, 16 and 17 in addition to the prior-art voltage determined by transistors 12, 14, 15 and 18. The additional component compensates for the error that may be introduced by an uncharged transistor 2 connected to the virtual-ground circuit of the memory array. The additional component is independent of variations in process between production runs.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A reference-column circuit for a virtual-ground read-only memory array, comprising:

first and second dummy memory cells having a common virtual-ground sensing terminal and having programming input terminals connected to a row conductor of said array, and a load transistor with primary current-path terminals connected between a source of reference potential and said common terminal of said dummy memory cells and with a control terminal connected to a source of supply voltage, wherein a non-common terminal of said first dummy memory cell is connected to an output of a grounding circuit, wherein a non-common terminal of said second dummy memory cell is connected to an output of a reference-voltage-supply circuit, wherein the voltage output of said reference-column circuit is taken from said common terminal of said dummy memory cells, and wherein said reference-voltage-supply circuit includes a first field-effect transistor with a source-drain path connected between said source of reference potential and said output of said reference-voltage-supply circuit and with a gate connected to said supply voltage source, and a second field-effect transistor with a source-drain path connected between said output of said reference-voltage-supply circuit and a circuit ground and with a gate connected to said circuit ground.

2. The reference column circuit of claim 1 in which said dummy memory cells have identical characteristics with other memory cells connected to said row conductor of said array.

3. The reference-column circuit of claim 1 in which said load transistor is a field-effect transistor with channel dimensions that differ from the channel dimensions of other field-effect load transistors of said array such that the resistance of said reference-column circuit load transistor is less than that of said other load transistors.

4. The reference-column circuit of claim 1 in which said dummy memory cells are floating-gate transistors.

5. The reference-column circuit of claim 1 in which said first and second field-effect transistors have identical characteristics with transistors of a virtual-ground transistor pair of said memory array.

6. The reference-column circuit of claim 5 in which all of said transistors are N-channel transistors.

7. The reference-column circuit of claim 1 in which said grounding circuit includes a first field-effect transistor with a source-drain path connected between said source of reference potential and said output of said grounding circuit and with a gate connected to a circuit ground, and a second field-effect transistor with a source-drain path connected between said output of said grounding circuit and said circuit ground and with a gate connected to said supply voltage source.

8. The reference-column circuit of claim 7 in which said first and second field-effect transistors have identical characteristics with transistors of a virtual-ground transistor pair of said memory array.

9. The reference-column circuit of claim 8 in which all of said transistors are N-channel transistors.

10. An improvement in a reference-column circuit comprising a load transistor with a primary conducting path connected between a source of reference potential and an output of said reference-column circuit, and a first dummy memory cell connected between said reference-column circuit output and an output of a grounding circuit, wherein said improvement includes a second dummy memory cell connected between said reference-column circuit output and a reference-voltage-supply circuit, and wherein said reference-voltage-supply circuit includes a first field-effect transistor with a source-drain path connected between the output of said reference-voltage-supply circuit and said reference potential source and with a gate connected to a supply voltage source, and a second field-effect transistor with a source-drain path connected between said output of said reference-voltage-supply circuit and a circuit ground and with a gate connected to said circuit ground.

11. The improvement of claim 10 in which said first and second field-effect transistors have identical characteristics with field-effect transistors used in said grounding circuit.

12. The improvement of claim 10 in which said second dummy memory cell has identical characteristics with said first dummy memory cell.

13. The improvement of claim 12 in which said dummy memory cells are floating-gate transistors.

* * * * *